(12) United States Patent
Young (10) Patent No.: US 7,888,864 B2
(45) Date of Patent: Feb. 15, 2011

(54) ELECTROLUMINESCENT DEVICES AND THEIR MANUFACTURE

(75) Inventor: Nigel D. Young, Redhill (GB)

(73) Assignee: TPO Display Corp. (TW)

( * ) Notice: Subject to any disclaimer, the term of this patent is extended or adjusted under 35 U.S.C. 154(b) by 559 days.

(21) Appl. No.: 10/534,321

(22) PCT Filed: Oct. 30, 2003

(86) PCT No.: PCT/IB03/04833

§ 371 (c)(1),
(2), (4) Date: May 9, 2005

(87) PCT Pub. No.: WO2004/044987

PCT Pub. Date: May 27, 2004

(65) Prior Publication Data

US 2006/0108914 A1    May 25, 2006

(30) Foreign Application Priority Data

Nov. 12, 2002    (GB) ................................ 0226401.8

(51) Int. Cl.
*H01J 1/62* (2006.01)
*H01J 63/04* (2006.01)
(52) U.S. Cl. ................. 313/506; 313/503; 313/504; 313/505; 445/23; 445/24
(58) Field of Classification Search ......... 313/498–512; 445/23, 24
See application file for complete search history.

(56) References Cited

U.S. PATENT DOCUMENTS

| | | | |
|---|---|---|---|
| 4,539,507 A | | 9/1985 | VanSlyke et al. |
| 6,046,547 A | * | 4/2000 | Nishio et al. ............. 315/169.3 |
| 6,693,296 B1 | * | 2/2004 | Tyan ............................ 257/40 |
| 6,861,799 B1 | * | 3/2005 | Friend et al. ................. 313/504 |

(Continued)

FOREIGN PATENT DOCUMENTS

EP    0717446 A2    6/1996

(Continued)

OTHER PUBLICATIONS

English-language translation of JP 2002-313572 A, from the JPO website.*

(Continued)

*Primary Examiner*—Nimeshkumar D Patel
*Assistant Examiner*—Thomas A Hollweg
(74) *Attorney, Agent, or Firm*—Thomas, Kayden, Horstemeyer & Risley, LLP.

(57) ABSTRACT

An EL device comprising a substrate (11), a light emissive structure comprising three series connected LEDs on the substrate (LED 1, 2, 3). Considering the diode LED1, it comprises organic light emissive material disposed (16-1) between an underlying ITO anode (12-1) and an overlying cathode (17-1) that is electrically connected in series to the underlying anode (12-2) of the diode LED2 through the thickness of the organic light emissive material (16-1). The connection can be made by using a wetting agent to prevent the organic light emissive material disposed (16-1) covering contact region (19-1) on the anode (12-2) so that the overlying cathode (17-1) can make a series connection with the underlying anode (12-2).

11 Claims, 6 Drawing Sheets

U.S. PATENT DOCUMENTS

| | | | |
|---|---|---|---|
| 2002/0011783 A1* | 1/2002 | Hosokawa | 313/504 |
| 2002/0041149 A1* | 4/2002 | Shimoda et al. | 313/504 |
| 2002/0057051 A1* | 5/2002 | Kobayashi | 313/504 |
| 2002/0063515 A1* | 5/2002 | Goto | 313/500 |
| 2002/0158835 A1* | 10/2002 | Kobayashi et al. | 345/100 |

FOREIGN PATENT DOCUMENTS

| | | |
|---|---|---|
| GB | 0130411 | 2/1918 |
| GB | 2347015 A | 8/2000 |
| JP | 200029404 | 8/2001 |
| JP | 2002313572 A | 10/2002 |
| JP | 200089691 | 10/2003 |
| JP | 200471570 | 9/2005 |
| WO | WO9013148 A1 | 11/1990 |
| WO | WO0139272 A1 | 5/2001 |
| WO | WO0241400 A1 | 5/2002 |

OTHER PUBLICATIONS

Office Action in Related Japanese Patent Application dated Aug. 17, 2010.

English Abstract of JP2000029404.

English Abstract of JP2000089691.

English Abstract of JP2004071570.

* cited by examiner

ELECTROLUMINESCENT DEVICES AND THEIR MANUFACTURE

This invention relates to an electroluminescent (EL) device which may be used in a flat panel display.

As well known in the art, light emissive material may be employed on a flat panel in a matrix of pixels to provide a display. Organic light emissive materials may be used, such as poly-phenylenevinylene (PPV), configured between underlying and overlying electrodes in the form of an anode and cathode that inject electrons and holes into the organic material, where they combine and generate photons. Examples of light emissive organic materials are described in PCT/WO90/13148 and U.S. Pat. No. 4,539,507. Examples of prior EL matrix displays are described in GB-A-2,347,015, PCT/WO01/39272 and PCT/WO02/41400.

The EL devices may be operated under the control of thin film transistors (TFTs) associated with the pixels, which switch them individually, for example as described in EP-A-0717446.

Typically, in EL devices, an anode electrode, which may be formed of indium titanium oxide (ITO), is deposited on the substrate. The organic light emissive polymer is then deposited over the anode, for example by ink jet printing and then the cathode is deposited over the organic polymer, for example by sputtering. The problem with this arrangement is that the organic polymer cannot be processed by conventional silicon lithography and etching techniques because the polymer materials are not resistant to the chemicals used in conventional photo lithography, and are degraded by exposure to water.

Thus, conventionally, a specially fabricated interconnect needs to be provided at the edge of each pixel or row or column in order to connect the cathode to circuitry on the flat panel. This is disadvantageous because it unduly complicates the circuitry. For example in our co-pending GB 0130411.2 there is described an arrangement in which a plurality of EL display devices are connected in series for an individual pixel. This has the advantage of reducing high voltage drops that can occur along power supply lines for the pixels but has the disadvantage that the series connection between the diodes requires complex masking and fabrication techniques.

The present invention provides both devices and methods of manufacture, in which a connection can be made through the organic light emissive material.

According to one aspect of the invention there is provided an EL device comprising a substrate, a light emissive structure on the substrate, the light emissive structure comprising organic light emissive material disposed between first and second electrode layers for supplying charge carriers into the organic material to cause it to emit light, the first and second electrode layers respectively underlying and overlying the organic light emissive material, and an electrically conductive region underlying the light emissive structure on the substrate, the second overlying electrode layer and the underlying conductive region being in electrical connection through the thickness of the organic light emissive material.

A transistor may be configured on the substrate, having its source drain path connected to the first, underlying electrode for controlling current flow through the light emissive structure.

The second electrode can be connected to the underlying conductive region in a number of different ways. In one embodiment, the underlying conductive region is treated in an area thereof in such a way as to repel the organic light emissive material, and the second electrode extends transversely through the thickness of the organic light emissive material to be electrically connected to the underlying conductive region in the treated area.

In another embodiment, the underlying conductive region is formed with electrically conductive protuberances which extend through the thickness of the organic light emissive material, and the second electrode is electrically connected to said protuberances.

In a further embodiment, the organic light emissive material is damaged in an area thereof overlying the second conductive region, and the second electrode is electrically connected to the underlying conductive region through the damaged area.

The invention enables light emissive structures to be connected in series, for example in a single pixel. In a device according to the invention with a first and a second said light emissive structure, the connections can be arranged so that for the first light emissive structure, the second overlying electrode layer is connected to the first underlying conductive region, and for the second light emissive structure, said first underlying electrode layer is connected to the first underlying conductive region.

The invention also includes a method of fabricating an EL device comprising fabricating a light emissive structure on a substrate, the light emissive structure comprising organic light emissive material disposed between first and second electrode layers for supplying charge carriers into the organic material to cause it to emit light, the first and second electrode layers respectively underlying and overlying the organic light emissive material, and an electrically conductive region underlying the light emissive structure on the substrate, and forming an electrical connection between the second overlying electrode layer and the underlying conductive region through the thickness of the organic light emissive material.

In order that the invention may be more fully understood, embodiments thereof will now be described by way of example with reference to the accompanying drawings in which.

Figure 1:
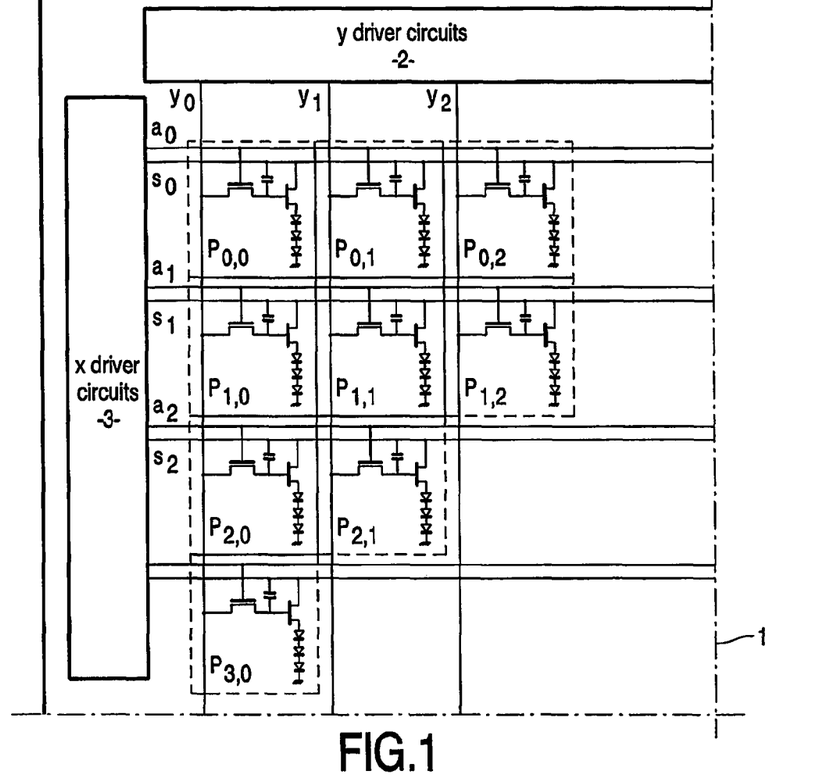
FIG. 1 is a schematic plan view of an EL device in accordance with the invention.
Figure 2:
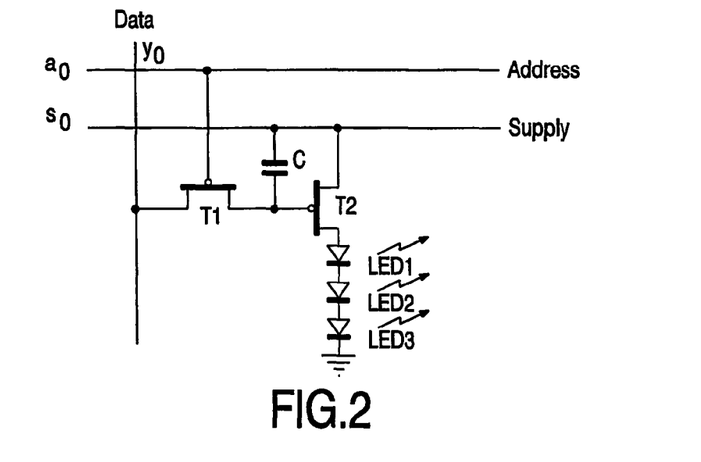
FIG. 2 is a schematic circuit diagram of a pixel of the device illustrated in FIG. 1.

Referring to FIGS. 1 and 2, an active matrix EL device comprises a rectangular array of pixels $P_{x,y}$ formed on a substrate 1 which may comprise a transparent glass plate or a substrate of plastics material. The pixels are supplied with data from column conductors $y_0, y_1, \ldots$ under the control of y driver circuits 2 shown schematically. Individual rows of pixels can be addressed individually by means of row address lines $a_0, a_1 \ldots$. Row supply lines $s_0, s_1 \ldots$ provide a current supply to the rows of pixels. The row lines are driven by x driver circuits 3 shown schematically. Only a few pixels are shown in FIG. 1 for simplicity whereas in practice there may be several hundred rows and columns of them.

An individual pixel $P_{0,0}$ is shown in more detail in FIG. 2 and it will be understood that the other pixels of the array are of a similar configuration. The pixel includes a capacitor C which becomes charged under the control of transistor T1. The charge on the capacitor C controls operation of a transistor T2 which has its source/drain path connected in series with three light emitting diodes LED1, 2 and 3 that themselves are connected in series between the supply line $s_0$ and ground.

In use, data is written to the capacitors C of the individual pixels row by row. Considering the pixel $P_{0,0}$, a row address signal is applied to row address line $a_0$, which switches on the source/drain path of transistor T1 so that the capacitor C charges to a level depending on the value of the data on column line $y_0$. The transistor T2 acts as a current source so that a current flows from the supply line so to ground through the series connected light emitting diodes LED1, 2 and 3, the current being a function of the level of charge stored by the capacitor C. The LEDs remain illuminated until a subsequent row address period when the charge on capacitor C is refreshed.

The advantage of having series connected LEDs in each pixel is that the current drawn through them is reduced as compared with a single LED, which reduces the voltage drop that can occur along the supply lines s, thereby improving the uniformity of the light outputs from the individual pixels across the matrix thereof. The individual LEDs1, 2, 3 may all produce light of the same colour e.g. a primary colour such as red light, and adjacent pixels may contain series connected LEDs that produce different primary colours so that the colour of the light produced can be controlled by mixing their different coloured outputs.

The series connection between the LEDs 1, 2 and 3 will now be described in more detail with reference to FIGS. 3 and 4.

Figure 3:
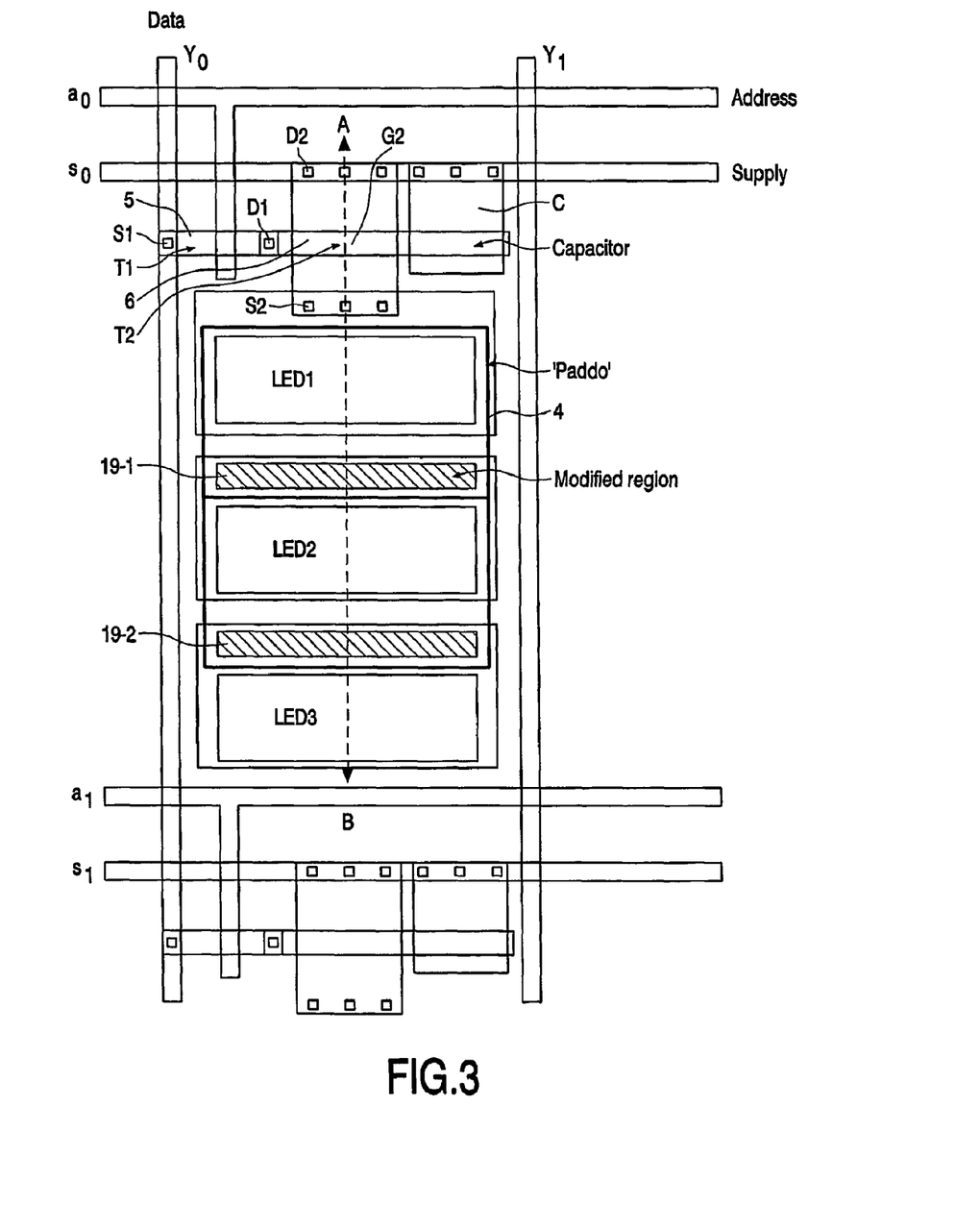
FIG. 3 is a schematic plan view of the pixel illustrated in FIG. 2.

Referring to FIG. 3, the pixel $P_{0,0}$ is shown in plan view located between the data column lines $y_0$, $y_1$ and the address and supply lines $a_0$, $s_0$ and $a_1$, $s_1$. The pixel $P_{0,0}$ contains transistors T1 and T2, capacitor C and the three light emitting diodes LED 1-3. As explained in more detail hereinafter, the light emitting diodes are bounded by a so-called "paddo" 4.

The transistor T1 has source S1 and drain D1 formed in a polysilicon track 5 in a manner well known in the art. Gate G1 of the transistor is coupled to the address line $a_0$. The polysilicon track 5 is connected to a conductive metal track 6, which may be formed of aluminium (1%) Tl, defined by photolithography and etching. Track 6 forms gate G2 of transistor T2 and also provides a connection to capacitor C.

Figure 4:
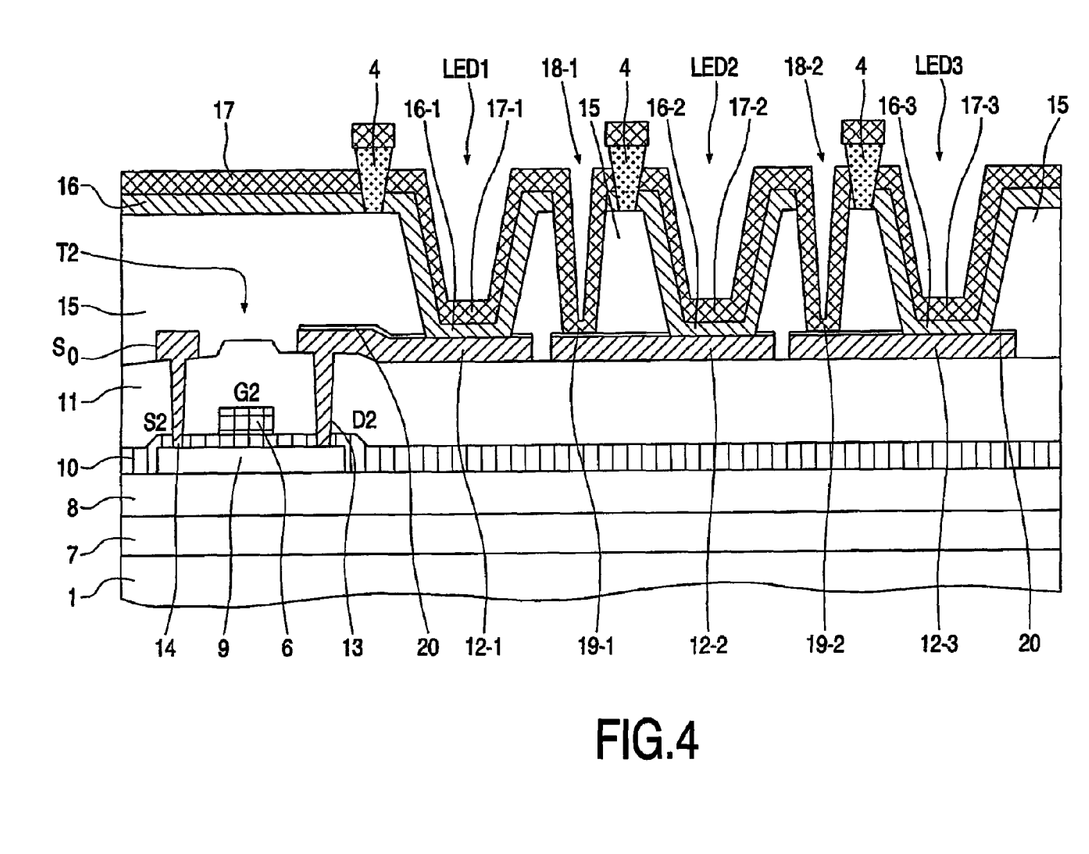
FIG. 4 is a schematic sectional view taken along the line A-B of FIG. 3.

The sectional view of FIG. 4 illustrates the series connection between LED1, 2 and 3 and the source/drain path of transistor T2 for the pixel $P_{0,0}$. The pixel is formed on the glass substrate 1 which is prepared by depositing a layer of silicon nitride 7 by conventional PECVD techniques to a thickness of 100 nm. Thereafter, layer 8 of silicon dioxide is grown to a thickness of 300-400 nm.

The thin film transistor T2 is formed on the substrate by generally conventional techniques. Transistor T2 includes a polysilicon channel 9 defined by conventional lithography and etching. As known in the art, channel may be a thickness of the order of 40 nm, deposited initially as an amorphous silicon layer, which is subsequently annealed for example by using an excimer laser to convert it into polysilicon and provide the source/drain channel for the transistor. The channel 9 is covered with an insulating silicon dioxide layer 10 which forms a gate insulator, to a thickness of e.g. 40-150 nm. The metal gate G2 is then formed, and the source and drain regions are implanted and activated, in a manner well known to those skilled in the art. The gate oxide layer 10 is overlaid by a further layer of silicon dioxide 11 deposited to a thickness of 200-500 nm.

The silicon dioxide layer 11 is overlaid by an ITO layer 12 to a thickness of 100-200 nm and is suitably patterned by conventional photolithography and etching techniques to form separate contact pads 12-1, 12-2 and 12-3 that provide interconnections between the series connected light emitting diodes LED1, 2 and 3. The contact pad 12a is connected to the drain region D2 of transistor T2 through a via 13. Alternatively, a metal strap (not shown) can be used to connect D2 to the ITO region 12-1. A similar via 14 provides a connection between the supply rail $s_0$ and the source S2 of the transistor. The supply rail so is formed of a metal to provide an adequate conductive path and the aforementioned strap may be formed as part of the same deposition step as the supply rail.

The ITO contact regions 12 are overlaid by the series connected LEDs, which are formed in recesses in a layer 15 of support material e.g. silicon dioxide, deposited to a thickness of 500-1000 nm.

The LEDs include individual portions of a layer 16 of light emissive material. The layer 16 may comprise PPV, although other light emissive organic materials may be used, as will be evident to those skilled in the art. In practice, the layer 16 may comprise dual sub-layers, namely a PEDOT polymer overlying the ITO layer 12, itself overlaid by the PPV. The PEDOT enhances hole injection from the ITO layer 12. The PEDOT is water soluble. The cathodes for the individual LEDs are formed from a layer 17 of reflective, electrically conductive material, usually a high work function metal for good electron injection. Calcium, barium and aluminium/barium alloy can been used. It may be desired to provide a transparent cathode so the light can be emitted upwards, in which case the cathode may comprise a thin metal with ITO on top. The cathode may be deposited by sputtering or physical vapour deposition (PVD). The LEDs are electrically separated from one another by the aforementioned "paddo" 4 which comprises an electrically insulating barrier made of photo resist or a defined polymer. As shown in FIG. 4, the paddo 4 is formed on the support layer 15 so as to have a thickness which increases with height. (Paddo is the Dutch word for mushroom and may be regarded as a term of art that describes the general nature of the barrier 4, as will be explained in more detail hereinafter).

Thus, the diode LED1 comprises underlying anode region 12-1, region 16-1 of the organic light emissive material and overlying cathode 17-1 formed from the metallic layer 17.

The silicon dioxide layer 15 also includes a recess 18-1 which allows the cathode 17-1 for LED1 to make electrical contact with the underlying anode 12-2 of LED2 in contact region 19-1, so as to establish a series connection between the diodes LED1 and LED2.

Diodes LED2 and LED3 are similarly connected in series. The various components of the diodes are shown in FIG. 4 with suffixes 2 and 3 respectively, so that LED2 comprises anode 12-2, PPV region 16-2 and cathode 17-2, and LED3 comprises anode 12-3, PPV region 16-3 and cathode 17-3.

Figure 5A:
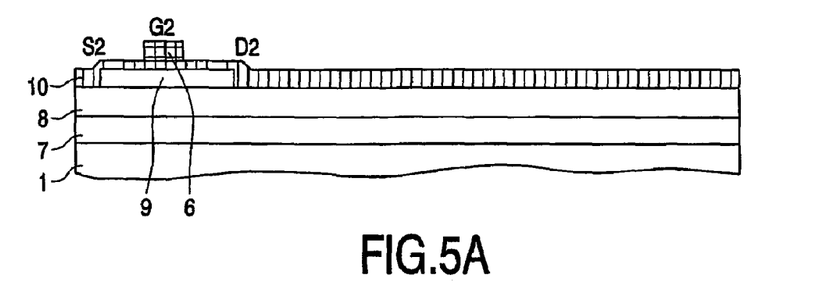
FIG. 5A-E illustrates steps in the fabrication of the device illustrated in FIGS. 3 and 4.

A method of fabricating the device will now be described in detail with reference to FIG. 5. Referring to FIG. 5A, the substrate 1 is prepared as previously described by depositing layer 7 of silicon nitride and the overlying layer 8 of silicon dioxide by a PECVD process. Then, layer 9 of amorphous silicon is deposited by PECVD and is then annealed, for example by an excimer laser so that the layer 9 is converted into polysilicon. The layer 9 is patterned by conventional photolithography and etching to define the channel region 9. Then, the silicon dioxide layer 10 is grown to a thickness of 40-150 nm. For further details, reference is directed to J. Appl. Phys. 82 (8) 15 Nov. 1997, S. D. Brotherton, J. D. McCulloch.

Thereafter, the Al (1%) Tl layer 6 is deposited to a thickness of 0.5-1 μm by sputter deposition. The resulting metallic layer is then patterned using conventional photolithographic and etching techniques to define the gate region G2 shown in FIG. 5A.

The gate region G2 may be used as a self-aligned mask to allow n+ dopant to be deposited in the source and drain regions S2, D2 of the channel 9 in a manner well known per se.

Figure 5B:
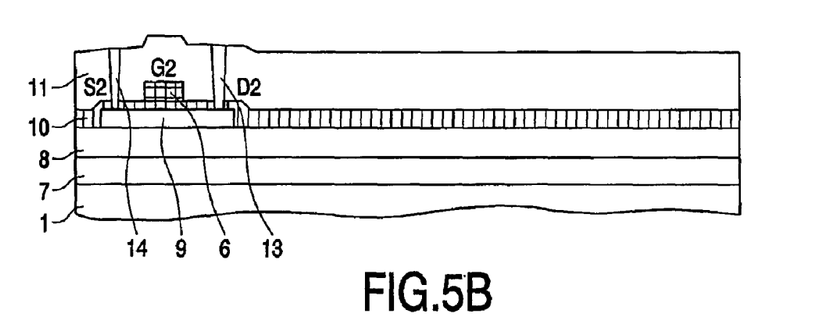

Referring to FIG. 5B, the silicon dioxide layer 11 is deposited by PECVD and the vias 13, 14 are formed by conventional photolithography and etching.

Figure 5C:
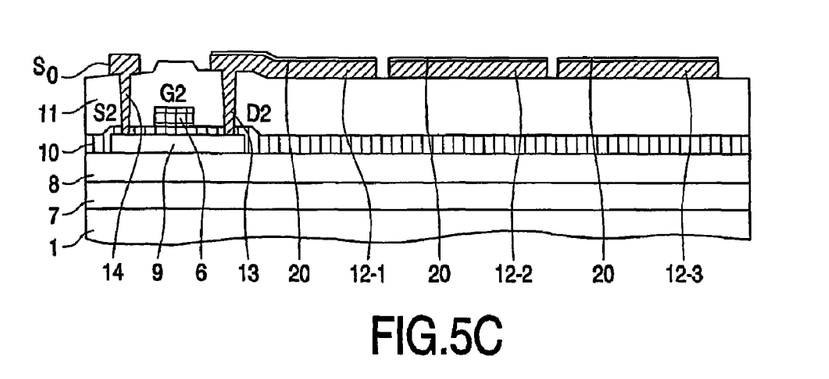

Then as shown in FIG. 5C, ITO layer 12 is deposited to overlie the layer 11 and also so as to extend into the via 13 to provide a drain connection. Also, the supply rail so is deposited so as to extend into via 14c and provide a source connection.

The layer 12 is then coated with a layer 20, which is repellent to the materials of the layer 16, namely the PEDOT and PPV. In this example the repellent layer 20 comprises a thin flash of a metal which does not oxidise easily, such as silver or gold deposited by PVD or other techniques known in the art. The ITO layer 12 and the repellent layer 20 are then patterned to provide the individual contact regions 12-1, 12-2 and 12-3 by conventional photolithography and etching.

Figure 5D:
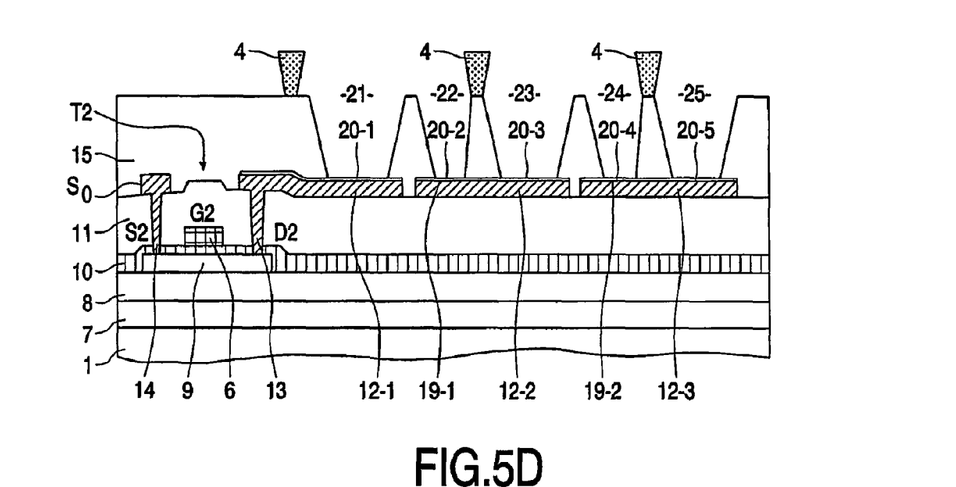

The oxide layer 15 is then deposited by PECVD and patterned by conventional photolithography and etching, so as to include recesses 21-25 as shown in FIG. 5D. The recesses 21-25 are etched in two separate groups. Initially the recesses 21, 23 and 25 are formed and the contact regions 12-1, 12-2 and 12-3 are exposed at the base of each of the recesses by the etching process. The exposed contact regions in recesses 21, 23 and 25 have a coating of with material 20 that is repellent to the light emissive layer 16. However, the light emissive organic layer 16 is to be applied into the recesses 21, 23 and 25 and so they need to be prepared to receive the light emissive material. To this end, exposed regions 20-1, 20-3 and 20-5 of the repellent coating at the bottom of the recesses 21, 23 and 25 are removed by conventional etching techniques.

Also, the sidewalls of the recesses 21, 23 and 25 are treated so as to enhance wetting by the subsequently applied layer configuration 16. The wetting enhancement may be carried out by applying a primer such as HMDS (hexamethyldisilizane), oxygen plasma exposure or UV ozone (UVO) exposure.

A resist, not shown, is applied to protect the recesses 21, 23 and 25 and then the recesses 22 and 24 are etched into the silicon dioxide layer 15. The etching exposes regions 20-2 and 20-4 of the coating 20 that is repellent to the layer 16. The resist is removed after formation of the recesses 22, 24. Then, the paddo 4 is formed around the perimeter of the regions which form LED1 and LED2 as shown in FIG. 5D and also in plan view in FIG. 3 by deposition of $SiO_2$ by PECVD and selective etching.

Figure 5E:
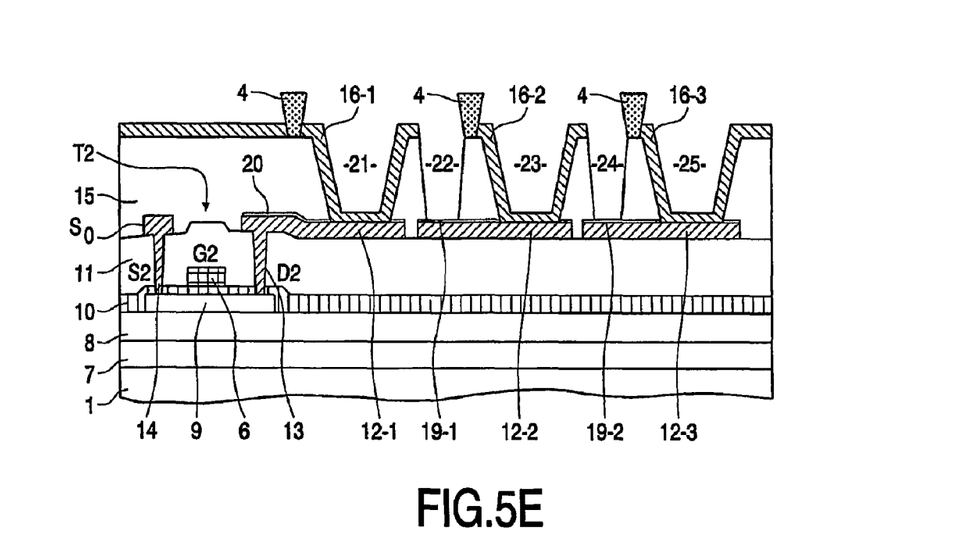

LEDs 1, 2 and 3 are then formed in the recesses 21, 23 and 25 and the series cathode connections between the diodes are fabricated in recesses 22 and 24, as will now be explained Referring to FIG. 5E the layer 16 is applied for example by spin coating or by ink jet printing as well known in the art. As previously explained, this may comprise overlying PEDOT and PPV sub-layers.

The paddo 4 separates the layer 16 into individual regions 16-1, 16-2 and 16-3 for the diodes LED1, 2 and 3 respectively. The regions 16-1, 16-2 and 16-3 are electrically insulated from one another. The region 16-1 covers the walls of recess 21, assisted by the aforementioned wetting enhancement, but does not cover the walls of the recess 22 due to the repelling action of the region 20-2 of the repellent coating 20 and as a result, the contact region 19-1 is not covered by layer region 16-1. Similarly, layer region 16-2 covers the sidewalls of recess 23, assisted by the wetting enhancement, but does not cover contact region 19-2 due to the repellent action of the region 20-4. Layer region 16-3 covers the sidewalls of recess 25, assisted by the aforementioned wetting enhancement.

Thereafter, metallic layer 17 is applied, for example by sputtering or PVD to achieve the configuration shown in FIG. 4. The effect of the paddo 4 is to provide a break in the continuity of the layer 17 so as to provide an electrically insulating barrier wall around the perimeter of diodes LED1 and LED2. The paddo is configured so that it is wider at its upper surface than at its base and as a result, the deposited layer 17 is broken where it overlies the paddo and the cross-sectional shape of the paddo wall inhibits the formation of a continuous layer, thereby producing a break in the layer 17 and electrically isolating the regions 17-1, 2 and 3 from each other. For further details of an example of use of a paddo, reference is directed to our WO02/41400 A1 published $23^{rd}$ May 2002.

Thus, from FIG. 4 it can be seen that the cathode region 17-1 overlies the PPV region 16-1 in LED1 and also extends into the recess 18-1, across the thickness of the PPV region 16-1 and forms an electrical contact with the underlying ITO region 12-2 in contact region 19-1. Thus, the cathode 17-1 forms a contact with the underlying anode region 19-1 of LED2, thereby providing a series connection between the two diodes. Similarly, LED2 is series connected to diode LED3 since the overlying cathode 17-2 LED2 extends into recess 18-2 transversely across the thickness of the PPV region 16-2 so as to form an electrical contact in region 19-2 with the underlying anode 12-3 of LED3. It will be understood that because a wetting agent was applied to recesses 21 and 23 shown in FIG. 5E, the PPV region does not adhere to the contact regions 19-1, 19-2 so that when the cathode layer 17 is applied, it forms a connection through the thickness of the PPV regions 16-1, 16-2 to provide the series connection between the diodes.

Figure 6:
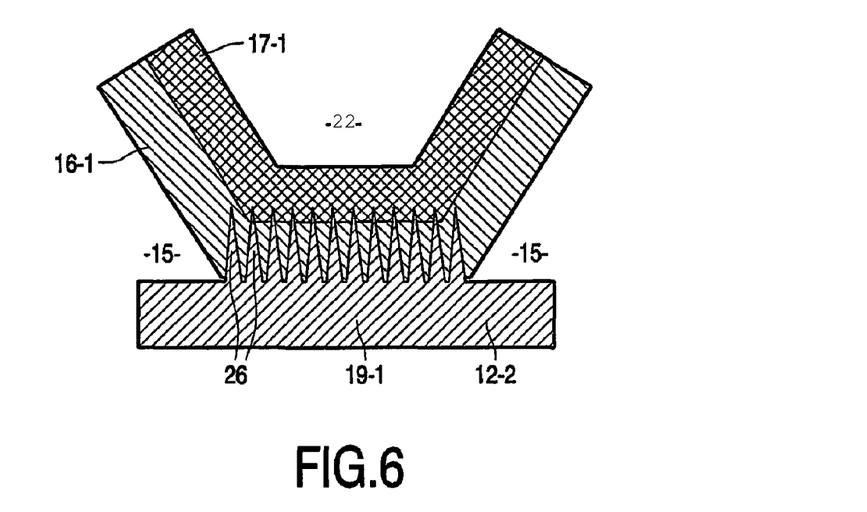
FIG. 6 illustrates a first alternative way of interconnecting the sub-pixels of the device of FIG. 4.

Alternative methods of preventing the PPV layer 16 from entering recesses 22 and 24 can be used and FIG. 6 illustrates a first alternative. The surface of contact region 19-1 is shown on an enlarged scale. The ITO contact region 12-2 is treated to provide a surface roughness such that a series of protuberances 26 are formed in the ITO layer. During fabrication of the device, no repellent layer need be used and the layer 16-1 of light emissive material may extend over the interior surface of recess 22. However, the protuberances 26 extend through the layer 16-1 and form an electrical connection with the metallic cathode 17-1. The protuberances 26 can be produced by roughening a thick ITO layer 12 for example of thickness 200-500 nm and etching it in the recess 18-1 only. A suitable wet etchant is ferric chloride and hydrochloric acid mixture, although a dry etch HCl/HBr mixture could be used. Another method of roughening is to deposit a metal such as aluminium on the ITO layer 12 and pattern it in the region of the recess. This will be quite grainy and rough, and will spike and hillock during the deposition of the oxide layer 15, or by means of a thermal treatment at 300-400 C.

Figure 7:
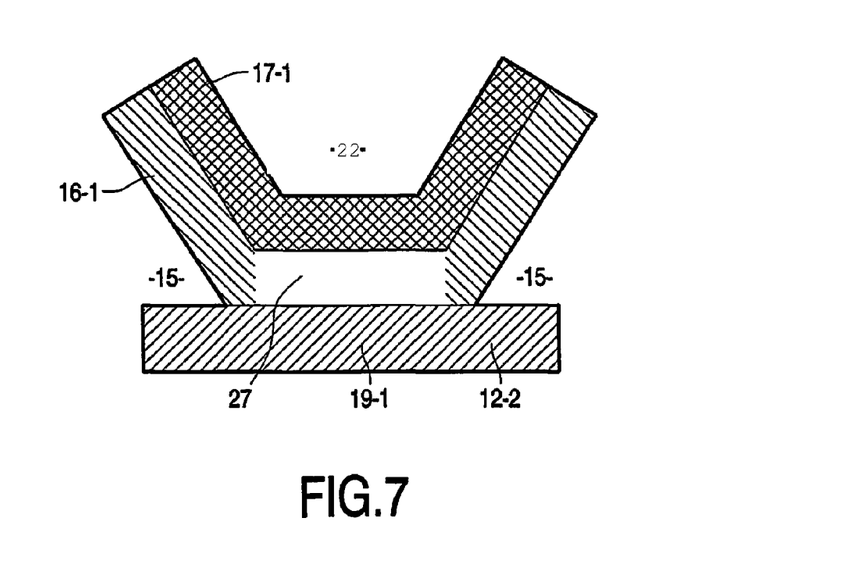
FIG. 7 illustrates a second alternative way of forming the connection between the sub-pixels.

Another alternative is illustrated in FIG. 7, in which no repellent is used but instead, the layer 16-1 is treated in the recess 18-1 to become electrically conductive in region 27 so that the overlying cathode 17-1 forms an electrical connection with contact recess 18-1 to become electrically conductive in region 27 so that the overlying cathode 17-1 forms an electrical connection with contact region 19-1 through the conductive region 26.

One way of treating the layer 16-1 is to get it wet, or to dope it with ions, for example from a salt solution, the wetting being carried out selectively at the bottom of the recess 18-1, for example by dunking the layer 16-1 in the salt solution at the bottom of the recess and drying it while the rest of the surface is protected with resist.

The treatment thus damages the light emissive properties of the layer 16, but since this occurs in the contact regions 19-1, 19-2, where light emission is not crucial to operation of the device, its light emitting properties are not degraded.

From reading the present disclosure, other variations and modifications will be apparent to persons skilled in the art. Such variations and modifications may involve equivalent and other features which are already known in the design, manufacture and use of electronic devices comprising electroluminescent devices and other semiconductor devices and component parts thereof and which may be used instead of or in addition to features already described herein.

The invention claimed is:

1. An electroluminescent device comprising:
   a substrate;
   a support layer having a plurality of recesses and being disposed on the substrate;
   a light emissive structure on the substrate, the light emissive structure comprising organic light emissive material disposed between first and second electrode layers for supplying charge carriers into the organic light emissive material to cause it to emit light, and the first and second electrode layers respectively underlying and overlying the organic light emissive material in a first recess of the plurality of recesses; and
   an electrically conductive region underlying the light emissive structure in a second recess of the plurality of recesses, the second electrode layer and the organic light emissive material extending to the second recess, wherein the electrically conductive region is formed with electrically conductive protuberances which extend through the thickness of the organic light emissive material, the second electrode layer is electrically connected to the electrically conductive protuberances, and the organic light emissive material partially covers the electrically conductive protuberances.

2. A device according to claim 1 including a transistor on the substrate having its source drain path connected to the first electrode layer for controlling current flowing through the light emissive structure.

3. A device according to claim 1 including a first and a second said light emissive structure, wherein for the first light emissive structure, the second electrode layer is connected to the electrically conductive region, and for the second light emissive structure, the first electrode layer is connected to the electrically conductive region, whereby the light emissive structures are electrically connected in series.

4. A device according to claim 3 wherein a common layer provides the electrically conductive region underlying the first light emissive structure and the first electrode layer of the second light emissive structure.

5. A device according to claim 3 including at least one further said light emissive structure connected in series with the first and second light emissive structures.

6. An electroluminescent device as claimed in claim 1 including a matrix ($P_{x,y}$) of said light emissive structures configured on said substrate.

7. A method of fabricating an electroluminescent device comprising:
   forming a support layer having a plurality of recesses on a substrate;
   fabricating an electrically conductive region on the substrate in a second recess of the plurality of recesses, wherein the electrically conductive region is formed with electrically conductive protuberances;
   fabricating a light emissive structure on the substrate, the light emissive structure comprising organic light emissive material disposed between first and second electrode layers for supplying charge carriers into the organic light emissive material to cause it to emit light, the first and second electrode layers respectively underlying and overlying the organic light emissive material in a first recess of the plurality of recesses, the second electrode layer and the organic light emissive material extending to the second recess and the electrically conductive region underlying the light emissive structure such that the electrically conductive protuberances extend through the thickness of the organic light emissive material, the second electrode layer is electrically connected to the electrically conductive protuberances, and the organic light emissive material partially covers the electrically conductive protuberances.

8. A method according to claim 7 including treating regions of the device such as to enhance wetting of the organic light emissive material on the first electrode layer.

9. An electroluminescent device fabricated by a method as claimed in claim 7.

10. A method of fabricating an electroluminescent device, the method comprising:
    forming a support layer having a plurality of recesses on a substrate;
    fabricating an electrically conductive region on the substrate in a second recess of the plurality of recesses, wherein the electrically conductive region is formed with electrically conductive protuberances;
    fabricating a first light emissive structure on a substrate, the first light emissive structure comprising: organic light emissive material; a first electrode layer underlying the organic light emissive material; and a second electrode layer overlying the organic light emissive material in a first recess of the plurality of recesses, the second electrode layer and the organic light emissive material extending to the second recess, wherein the first and second electrode layers are adapted to supply charge carriers into the organic light emissive material to cause the organic light emissive material to emit light and the electrically conductive region underlies the first light emissive structure such that the electrically conductive protuberances extend through the thickness of the organic light emissive material, the second electrode layer is electrically connected to the electrically conductive protuberances, and the organic light emissive material partially covers the electrically conductive protuberances;
    fabricating a second light emissive structure, wherein for the second light emissive structure, a first electrode layer underlying an organic light emissive material is connected to the electrically conductive region which underlies the first light emissive structure and is located in said second recess such that the first and second light emissive structures are electrically connected in series.

11. An electroluminescent device comprising:
    a substrate;
    a support layer having a plurality of recesses and being disposed on the substrate;

an electrically conductive region on the substrate in a second recess of the plurality of recesses, wherein the electrically conductive region is formed with electrically conductive protuberances;

a first light emissive structure on a substrate, the first light emissive structure comprising: organic light emissive material; a first electrode layer underlying the organic light emissive material; and a second electrode layer overlying the organic light emissive material in a first recess of the plurality of recesses, the second electrode layer and the organic light emissive material extending to the second recess, wherein the first and second electrode layers are adapted to supply charge carriers into the organic light emissive material to cause the organic light emissive material to emit light and the electrically conductive region underlies the first light emissive structure such that the electrically conductive protuberances extend through the thickness of the organic light emissive material, the second electrode layer is electrically connected to the electrically conductive protuberances, and the organic light emissive material partially covers the electrically conductive protuberances; and a second light emissive structure, wherein for the second light emissive structure, a first electrode layer underlying an organic light emissive material is connected to the electrically conductive region which underlies the first light emissive structure and is located in said second recess such that the first and second light emissive structures are electrically connected in series.

* * * * *